(12) United States Patent
Kamakura et al.

(10) Patent No.: US 10,911,018 B2
(45) Date of Patent: Feb. 2, 2021

(54) VIBRATOR DEVICE AND ELECTRONIC APPARATUS

(71) Applicant: Seiko Epson Corporation, Tokyo (JP)

(72) Inventors: Tomoyuki Kamakura, Matsumoto (JP); Yusuke Matsuzawa, Chino (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/886,901

(22) Filed: May 29, 2020

(65) Prior Publication Data
US 2020/0382095 A1 Dec. 3, 2020

(30) Foreign Application Priority Data
May 30, 2019 (JP) .................. 2019-101471

(51) Int. Cl.
*H03H 9/02* (2006.01)
*H03H 3/02* (2006.01)
*H03H 9/05* (2006.01)
*H03H 9/19* (2006.01)
*H03B 5/32* (2006.01)
*H03H 9/10* (2006.01)

(52) U.S. Cl.
CPC .......... *H03H 9/02125* (2013.01); *H03B 5/32* (2013.01); *H03H 3/02* (2013.01); *H03H 9/0519* (2013.01); *H03H 9/1021* (2013.01); *H03H 9/19* (2013.01); *H03H 2003/022* (2013.01)

(58) Field of Classification Search
CPC ............. H03H 9/02125; H03H 9/1021; H03H 9/0519; H03H 9/19; H03H 3/02; H03H 2003/022; H03B 5/35
See application file for complete search history.

(56) References Cited

U.S. PATENT DOCUMENTS

| 2010/0164120 A1* | 7/2010 | Nakayama | H01L 24/05 257/774 |
| 2013/0107467 A1* | 5/2013 | Kanno | H05K 3/4076 361/728 |
| 2018/0166354 A1* | 6/2018 | Imayoshi | H05K 3/46 |

FOREIGN PATENT DOCUMENTS

JP 2017-126865 A 7/2017

* cited by examiner

*Primary Examiner* — Jeffrey M Shin
(74) *Attorney, Agent, or Firm* — Harness, Dickey & Pierce, P.L.C.

(57) ABSTRACT

A vibrator device includes a silicon substrate having a through hole, a first terminal placed on a first surface of the silicon substrate, a second terminal placed on a second surface opposite to the first surface of the silicon substrate, a wire passing the through hole and electrically coupling the first terminal and the second terminal, a resin layer placed between the wire and an inner wall defining the through hole, a silicon oxide layer placed between the resin layer and the inner wall, and a vibrator element bonded to the first terminal.

9 Claims, 6 Drawing Sheets

VIBRATOR DEVICE AND ELECTRONIC APPARATUS

The present application is based on, and claims priority from, JP Application Serial Number 2019-101471, filed May 30, 2019, the disclosure of which is hereby incorporated by reference herein in its entirety.

BACKGROUND

1. Technical Field

The present disclosure relates to a vibrator device and electronic apparatus.

2. Related Art

Oscillators using vibrator elements such as quartz crystal vibrators are known and widely used as reference frequency sources and oscillation sources for various electronic apparatuses. In a vibrator device including the oscillator, the vibrator element is held within a cavity having air-tightness.

For example, JP-A-2017-126865 discloses an electronic component using a quartz crystal vibrator in which the quartz crystal vibrator is held within a cavity of a package having a base substrate and a lid substrate and the quartz crystal vibrator is coupled to an external coupling electrode via a through electrode formed in a through hole penetrating the base substrate. An electrode film is formed on an inner side surface of the through hole via an insulating film of an $SiO_2$ film. The $SiO_2$ film formed on the inner side surface of the through hole is formed by the CVD method.

It is difficult to form the $SiO_2$ film formed on the inner side surface of the through hole to be thicker than that formed on the front surface or back surface of the base substrate. Accordingly, parasitic capacitance formed between the base substrate and the electrode film is larger.

SUMMARY

The present disclosure has been achieved to solve at least a part of the above described problem and can be realized as the following aspects or application examples.

A vibrator device according to an application example includes a silicon substrate having a through hole, a first terminal placed on a first surface of the silicon substrate, a second terminal placed on a second surface opposite to the first surface of the silicon substrate, a wire passing the through hole and electrically coupling the first terminal and the second terminal, a resin layer placed between the wire and an inner wall defining the through hole, a silicon oxide layer placed between the resin layer and the inner wall, and a vibrator element bonded to the first terminal.

An electronic apparatus according to an application example includes the above described vibrator device, and an arithmetic circuit that operates by an output signal from the vibrator device.

DESCRIPTION OF EXEMPLARY EMBODIMENTS

As below, preferred embodiments of the present disclosure will be explained in detail using the drawings. The following embodiments do not unduly limit the present disclosure described in the appended claims. Not all of the configurations to be described are essential component elements of the present disclosure.

1. First Embodiment

1.1. Vibrator Device

Figure 1:
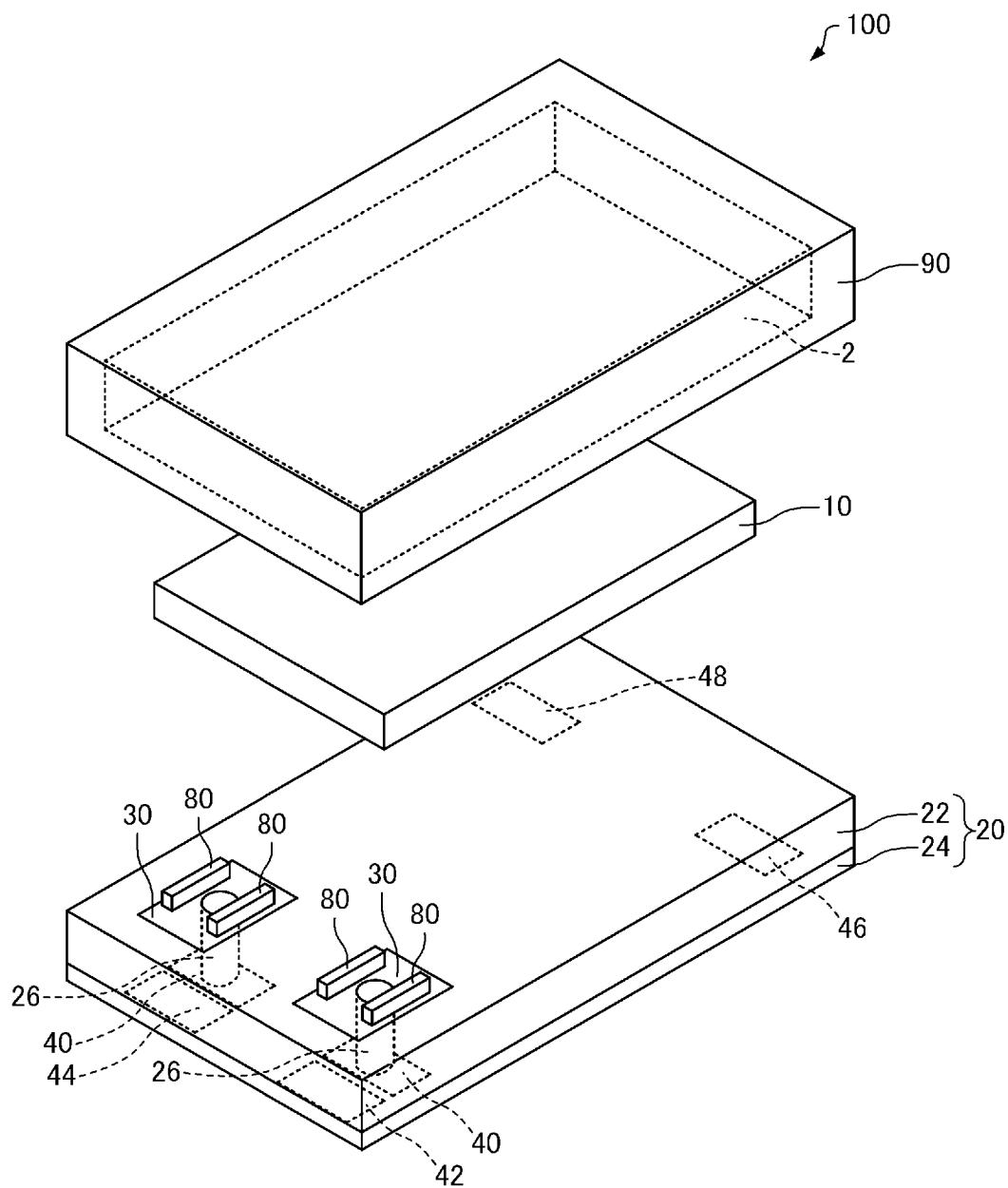
FIG. 1 is an exploded perspective view schematically showing a vibrator device according to a first embodiment.
Figure 2:
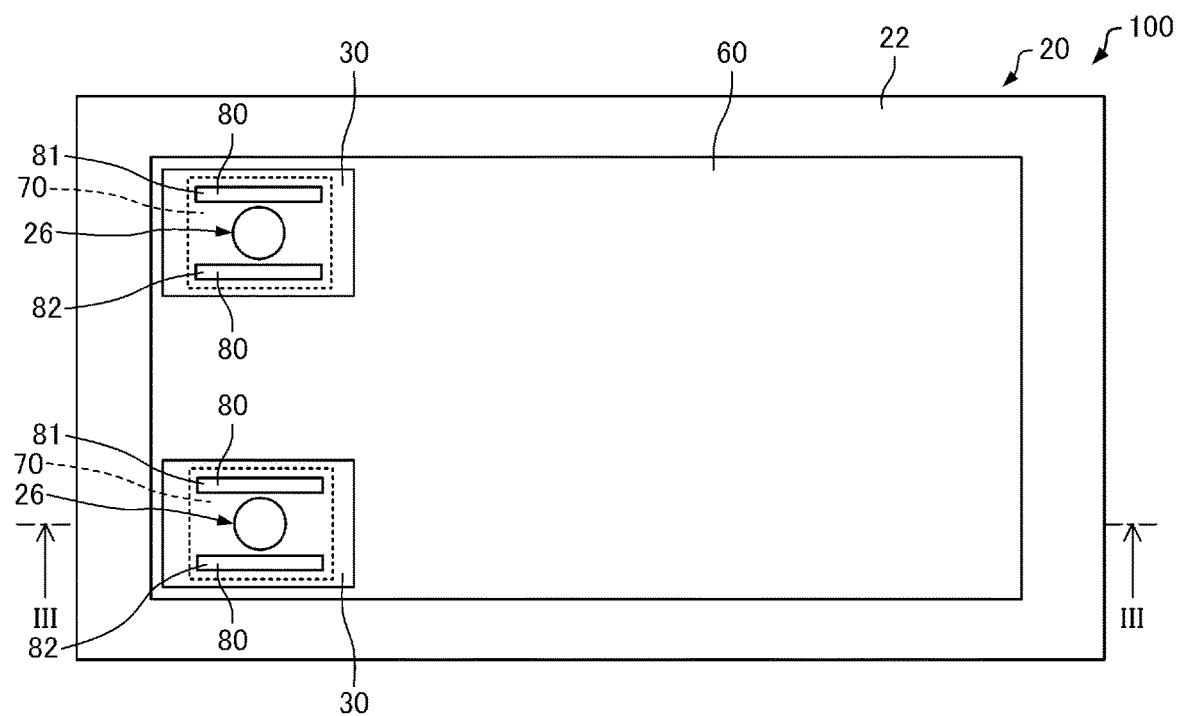
FIG. 2 is a plan view schematically showing the vibrator device according to the first embodiment.
Figure 3:
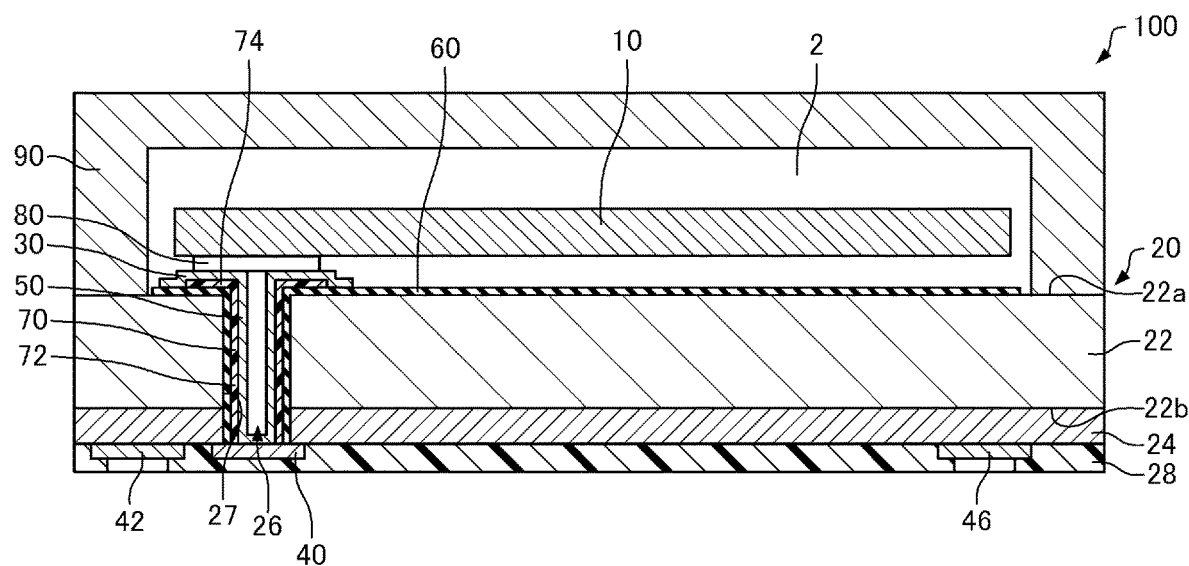
FIG. 3 is a sectional view schematically showing the vibrator device according to the first embodiment.

First, the vibrator device according to the first embodiment will be explained with reference to the drawings. FIG. 1 is an exploded perspective view schematically showing the vibrator device 100 according to the first embodiment. FIG. 2 is a plan view schematically showing the vibrator device 100 according to the first embodiment. Note that, in FIG. 2, only an IC (Integrated Circuit) board 20 of the vibrator device 100 is shown for convenience. FIG. 3 is a sectional view schematically showing the vibrator device 100 according to the first embodiment. Note that FIG. 3 is a sectional view along line III-III shown in FIG. 2. As below, in this specification, the position relationships in the vibrator device 100 will be explained relatively with a lid 90 side as the upside and the IC board 20 side as the downside.

As shown in FIGS. 1 to 3, the vibrator device 100 includes a vibrator element 10, the IC board 20, first terminals 30, second terminals 40, an external electrode 42, an external electrode 44, an external electrode 46, an external electrode 48, wires 50, a silicon oxide layer 60, resin layers 70, metal bumps 80, and the lid 90.

The vibrator device 100 is e.g. an oscillator. The IC board 20 includes a silicon substrate 22 and a circuit unit 24. The silicon substrate 22 and the lid 90 form a cavity 2 having air-tightness. The vibrator element 10 is held within the cavity 2. The cavity 2 is air-tightly sealed. For example, the cavity 2 is in a reduced-pressure condition. Thereby, the vibrator element 10 can be stably driven. Note that the cavity 2 is not limited in the reduced-pressure condition, but the cavity 2 may be filled with e.g. an inert gas atmosphere.

The vibrator element 10 has e.g. a vibrator substrate and an electrode placed on a surface of the vibrator substrate. The vibrator substrate is formed of e.g. an AT cut quartz crystal substrate that vibrates in a thickness-shear vibration mode. The AT cut quartz crystal substrate has third-order frequency-temperature characteristics. The vibrator substrate is formed from the AT cut quartz crystal substrate, and thereby, the vibrator element 10 having excellent temperature characteristics can be obtained.

The vibrator substrate is not limited to that formed from the AT cut quartz crystal substrate, but may be formed from another quartz crystal substrate than the AT cut quartz crystal substrate, e.g. an X cut quartz crystal substrate, Y cut quartz crystal substrate, Z cut quartz crystal substrate, BT cut quartz crystal substrate, SC cut quartz crystal substrate, or ST cut quartz crystal substrate. Further, the vibrator element 10 is not limited to the piezoelectrically driven vibrator element, but may be an electrostatically driven vibrator element using an electrostatic force.

The constituent material of the vibrator substrate is not limited to the quartz crystal, but may be piezoelectric single crystal of e.g. lithium niobate, lithium tantalate, lithium tetraborate, langasite, potassium niobate, or gallium phosphate, or another piezoelectric single crystal. Alternatively, the vibrator element 10 may be e.g. the so-called MEMS (Micro Electro Mechanical Systems) vibrator element in which a piezoelectric film and an electrode are placed on a substrate such as a silicon substrate. The piezoelectric film is e.g. aluminum nitride. The electrode may be molybdenum, titanium, gold, nickel, aluminum, titanium nitride, or the like.

The vibrator element 10 is not limited to the element that vibrates in the thickness-shear vibration mode, but e.g. a tuning-fork type vibrator element having a plurality of vibration arms that flexurally vibrate in in-plane directions, tuning-fork type vibrator element having a plurality of vibration arms that flexurally vibrate in out-of-plane directions, gyro sensor element having a drive arm for drive vibration and a detection arm for detection vibration detects an angular velocity, or an acceleration sensor element having a detection unit that detects an acceleration.

Therefore, examples of the vibrator device 100 include various oscillators such as a quartz crystal oscillator, voltage controlled crystal oscillator, temperature compensated crystal oscillator, oven controlled crystal oscillator, voltage controlled SAW (Surface Acoustic Wave) oscillator, SAW oscillator, and MEMS oscillator, an inertial sensor such as an acceleration sensor or angular velocity sensor, a force sensor such as a tilt sensor, or the like.

The IC board 20 has the silicon substrate 22 and the circuit unit 24. The silicon substrate 22 is a semiconductor substrate formed by high-purity single-crystal silicon. A dopant is added to the silicon substrate 22 and the silicon substrate 22 has conductivity. The silicon substrate 22 has a first surface 22a and a second surface 22b opposite to the first surface 22a. The silicon substrate 22 has two through holes 26. In the illustrated example, the through holes 26 penetrate the silicon substrate 22 and the circuit unit 24.

The silicon substrate 22 supports the vibrator element 10. Further, the silicon substrate 22 is used as a substrate for formation of the circuit unit 24.

The circuit unit 24 has a diffusion layer to which a dopant in a higher concentration than that of the silicon substrate 22 is added, and a rewiring layer including conducting portions such as wires and lands electrically coupled to the diffusion layer, insulating films insulating the conducting portions, etc. These diffusion layer and rewiring layer form circuit elements including transistors, diodes, resistors, and capacitors. In the circuit unit 24, predetermined circuits are formed by combinations of these circuit elements. The circuit unit 24 is e.g. an integrated circuit (IC) and electrically coupled to the second terminals 40. Thereby, the circuit unit 24 is electrically coupled to the vibrator element 10.

The circuit unit 24 is provided on the second surface 22b of the silicon substrate 22. As described above, the IC board 20 has the circuit unit 24 and forms a part of a package forming the cavity 2. Accordingly, in the vibrator device 100, the thickness and size can be reduced.

The circuit unit 24 is covered by a passivation film 28 that protects the circuit unit 24. The passivation film 28 is e.g. a silicon nitride layer.

The first terminals 30 are placed on the first surface 22a of the silicon substrate 22. In the example shown in FIG. 3, the first terminals 30 are placed on the first surface 22a of the silicon substrate 22 via the silicon oxide layer 60 and the resin layers 70. The first terminals 30 are e.g. electrode pads of a metal such as aluminum.

The vibrator element 10 is bonded to the first terminals 30 via the metal bumps 80. The first terminals 30 and the vibrator element 10 are electrically and mechanically coupled via the metal bumps 80. The two first terminals 30 are placed on the first surface 22a of the silicon substrate 22 for respectively coupling to the two electrodes of the vibrator element 10. The vibrator element 10 is bonded to the two first terminals 30, and thereby, the vibrator element 10 is cantilevered.

The second terminals 40 are placed on the second surface 22b of the silicon substrate 22. In the example shown in FIG. 3, the second terminals 40 are placed on the circuit unit 24. The two second terminals 40 are placed on the second surface 22b of the silicon substrate 22 for respectively coupling to the two first terminals 30. The second terminals 40 are electrically coupled to the first terminals 30 via the wires 50. Thereby, signals for driving the vibrator element 10 can be output from the circuit unit 24 to the vibrator element 10 to vibrate the vibrator element 10. The second terminals 40 are e.g. electrode pads of a metal such as aluminum.

The external electrode 42, the external electrode 44, the external electrode 46, and the external electrode 48 are placed on the second surface 22b of the silicon substrate 22. The external electrode 42, the external electrode 44, the external electrode 46, and the external electrode 48 are placed on e.g. the circuit unit 24. The external electrode 42, the external electrode 44, the external electrode 46, and the external electrode 48 are respectively electrically coupled to the circuit unit 24. Thereby, arbitrary signals can be input to the circuit unit 24 or arbitrary signals from the circuit unit 24 can be output via the external electrode 42, the external electrode 44, the external electrode 46, and the external electrode 48.

The wires 50 pass the through holes 26 and electrically couple the first terminals 30 placed on the first surface 22a of the silicon substrate 22 and the second terminals 40 placed on the second surface 22b. In the vibrator device 100, there are two sets of the first terminals 30 and the second terminals 40, and the two wires 50 are placed.

The wires 50 are formed using e.g. a technique of TSV (Through Silicon Via). The wires 50 are placed on inner walls 27 that define the through holes 26 via the silicon oxide layer 60 and the resin layers 70. The inner walls 27 are surfaces of the silicon substrate 22, defining the through holes 26. The inner walls 27 couple the first surface 22a and the second surface 22b of the silicon substrate 22. The material of the wires 50 is e.g. a metal such as aluminum. For example, the materials of the wires 50, the first terminals 30, and the second terminals 40 are the same.

As shown in FIG. 3, the wires 50 are formed in film forms on the inner walls 27. Accordingly, spaces surrounded by the wires 50 are formed within the through holes 26. Note that the wires 50 may fill the through holes 26, not forming the spaces within the through holes 26 (not shown).

The silicon oxide layer 60 is placed on the inner walls 27 defining the through holes 26. The silicon oxide layer 60 is placed between the inner walls 27 and the resin layers 70. The silicon oxide layer 60 electrically insulates the silicon substrate 22 and the wires 50. The silicon oxide layer 60 is further placed on the first surface 22a of the silicon substrate 22. The silicon oxide layer 60 electrically insulates the silicon substrate 22 and the first terminals 30.

The resin layer 70 has a first portion 72 placed on the inner wall 27 and a second portion 74 placed on the first surface 22a of the silicon substrate 22.

The first portion 72 of the resin layer 70 is placed between the wire 50 and the inner wall 27. The silicon oxide layer 60 and the first portion 72 are placed between the wire 50 and the inner wall 27. On the inner wall 27, the silicon oxide layer 60, the first portion 72, and the wire 50 are sequentially placed from the inner wall 27 side. The first portion 72 is covered by the wire 50. Within the through hole 26, the whole first portion 72 is covered by the wire 50 and the first portion 72 is not exposed.

The second portion 74 of the resin layer 70 is placed between the first surface 22a of the silicon substrate 22 and the first terminal 30. The silicon oxide layer 60 and the second portion 74 are placed between the first surface 22a of the silicon substrate 22 and the first terminal 30. On the first surface 22a of the silicon substrate 22, the silicon oxide layer 60, the second portion 74, and the first terminal 30 are sequentially placed from the first surface 22a side. The second portion 74 of the resin layer 70 is covered by the first terminal 30. In the example shown in FIG. 2, the whole second portion 74 is covered by the first terminal 30 and the second portion 74 is not exposed. That is, the resin layer 70 is covered by the wire 50 and the first terminal 30 and not exposed.

As shown in FIG. 2, the second portions 74 overlap with the first terminals 30 in a plan view. The resin layers 70 overlap with the metal bumps 80 in the plan view. In the example shown in FIG. 2, the metal bumps 80 are placed only in the portions overlapping with the resin layers 70 in the plan view. Note that the plan view is a view seen along an axis perpendicular to the first surface 22a of the silicon substrate 22.

The material of the resin layers 70 is e.g. a resin such as phenol resin or acrylic resin. The resin layers 70 are softer than the silicon oxide layer 60. For example, Vickers hardness of the resin layers 70 is smaller than Vickers hardness of the silicon oxide layer 60.

The metal bumps 80 join the vibrator element 10 and the first terminals 30. The metal bumps 80 are e.g. gold bumps. As shown in FIGS. 1 and 2, the plurality of metal bumps 80 are provided for the single first terminal 30. In the example shown in FIGS. 1 and 2, the two metal bumps 80 are provided for the single first terminal 30. The plurality of metal bumps 80 are provided around the through holes 26. That is, in the plan view, the plurality of metal bumps 80 do not overlap with the through holes 26.

The first metal bump 81 as one of the two metal bumps 80 and the second metal bump 82 as the other of the two metal bumps 80 are placed in positions with the through hole 26 in between in the plan view. That is, the through hole 26 is placed between the first metal bump 81 and the second metal bump 82 in the plan view.

The first metal bump 81 and the second metal bump 82 have shapes elongated in the plan view. In the illustrated example, the planar shapes of the first metal bump 81 and the second metal bump 82 are rectangular shapes. The first metal bump 81 and the second metal bump 82 are arranged in directions orthogonal to the elongation directions to be elongated in the same directions in the plan view.

Note that, in the above description, the case where the two metal bumps 80 are placed for the single first terminal 30 is explained, however, three or more metal bumps 80 may be placed for the single first terminal 30. Here, the three or more metal bumps 80 may include the first metal bump 81 and the second metal bump 82 placed with the through hole 26 in between in the plan view. The shapes and arrangement of the metal bumps 80 are not limited to those described as above. For example, the first metal bump 81 and the second metal bump 82 may have different lengths and shapes, and the first metal bump 81 and the second metal bump 82 may be arranged along the short side of the first terminal 30.

The lid 90 is bonded to the first surface 22a of the silicon substrate 22. The lid 90 has a recess to be the cavity 2 and bonded to the first surface 22a of the silicon substrate 22 so that the vibrator element 10 can be held in the recess. The material of the lid 90 is e.g. silicon. Note that, as the material of the lid 90, a semiconductor substrate of other than silicon may be used, or various metal materials or glass may be used.

The silicon substrate 22 and the lid 90 are directly bonded. The direct bonding may be any type of bonding as long as the bonding does not require an intervening material between two bonding surfaces of the same material. When the lid 90 is silicon, the silicon materials of the silicon substrate 22 and the lid 90 may be bonded. Alternatively, films of gold or the like may be placed on the respective silicon substrate 22 and lid 90 and the films may be bonded. For example, the direct bonding includes activated bonding such as room-temperature activated bonding or plasma activated bonding and diffusion bonding. In the direct bonding, the bonding strength and air-tightness of bonded interfaces are particularly increased, and thus, the highly reliable vibrator device 100 can be realized. Alternatively, other appropriate bonding method than direct bonding may be used according to the material of the lid 90. For example, bonding using a brazing filler material such as cobalt-nickel alloy or low-melting-point glass or anodic bonding may be used.

Figure 4:
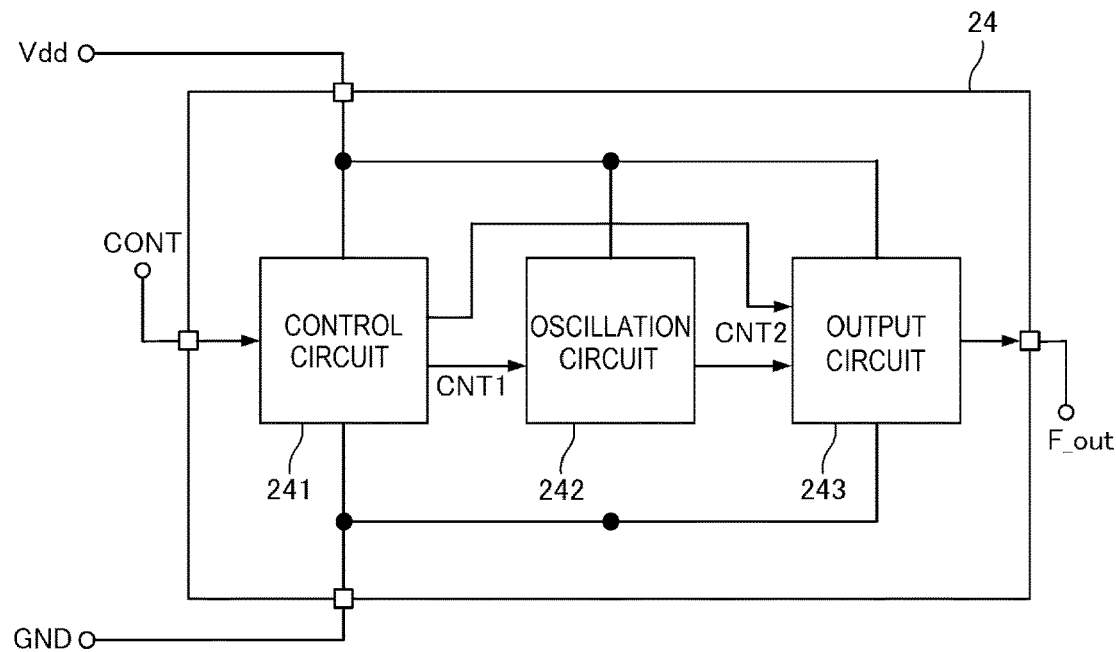
FIG. 4 is a block diagram showing a circuit configuration of a circuit unit.

FIG. 4 is a block diagram showing the circuit configuration of the circuit unit 24. The circuit unit 24 includes a control circuit 241, an oscillation circuit 242, and an output circuit 243. A power supply potential Vdd and a ground potential GND are respectively coupled to the control circuit 241, the oscillation circuit 242, and the output circuit 243.

A control signal CONT can be externally input to the control circuit 241. Further, a control signal CNT1 can be output from the control circuit 241 to the oscillation circuit 242, and a control signal CNT2 can be output from the control circuit 241 to the output circuit 243.

An output signal output from the oscillation circuit 242 can be externally output through the output circuit 243.

The power supply potential Vdd is coupled to the external electrode 42, the ground potential GND is coupled to the external electrode 44, the control signal CONT is input to the external electrode 46, and an output signal F_out is output from the external electrode 48. Note that the functions of the external electrodes 42, 44, 46, and 48 are examples and not limited to the examples.

Figure 5:
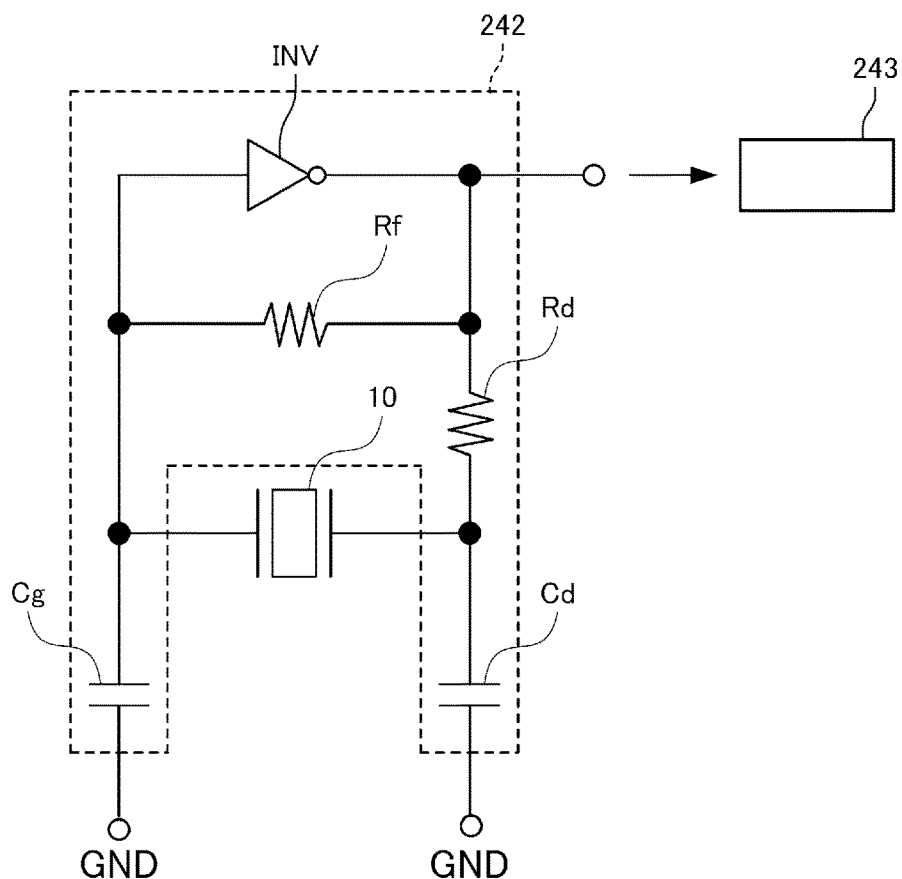
FIG. 5 is a circuit diagram showing an oscillation circuit.

FIG. 5 is a circuit diagram showing the oscillation circuit 242. The oscillation circuit 242 shown in FIG. 5 is a region surrounded by broken lines. The oscillation circuit 242 is electrically coupled to the second terminals 40 and generates an oscillation signal. The vibrator element 10 may be oscillated by the oscillation circuit 242.

As shown in FIG. 5, the oscillation circuit 242 includes an inverter INV and a feedback resistor Rf coupled in parallel to the vibrator element 10. Further, an amplitude limiting resistor Rd is coupled between the feedback resistor Rf and the vibrator element 10 in a line between the output side of the inverter INV and the ground potential GND.

A frequency trimming capacitor Cg is coupled between the input side of the inverter INV and the ground potential GND. Further, a frequency trimming capacitor Cd is coupled between the amplitude limiting resistor Rd and the ground potential GND.

As described above, the circuit unit 24 includes the oscillation circuit 242 for driving the vibrator element 10. Thereby, the vibrator device 100 may resonant-drives the vibrator element 10 and output a clock signal to the output circuit 243.

1.2. Method of Manufacturing Vibrator Device

FIGS. 6 to 11 are sectional views schematically showing the manufacturing process of the vibrator device 100.

Figure 6:
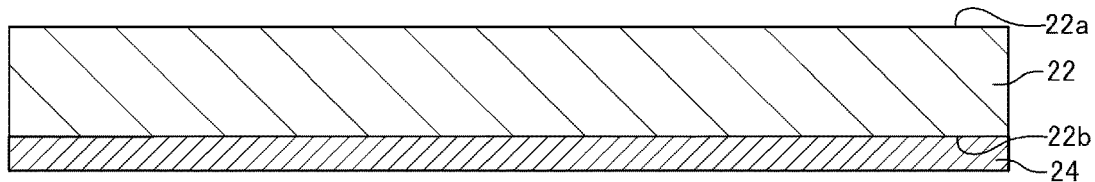
FIG. 6 is a sectional view schematically showing a manufacturing process of the vibrator device according to the first embodiment.

First, as shown in FIG. 6, the silicon substrate 22 with the circuit unit 24 formed thereon in advance is prepared.

Figure 7:
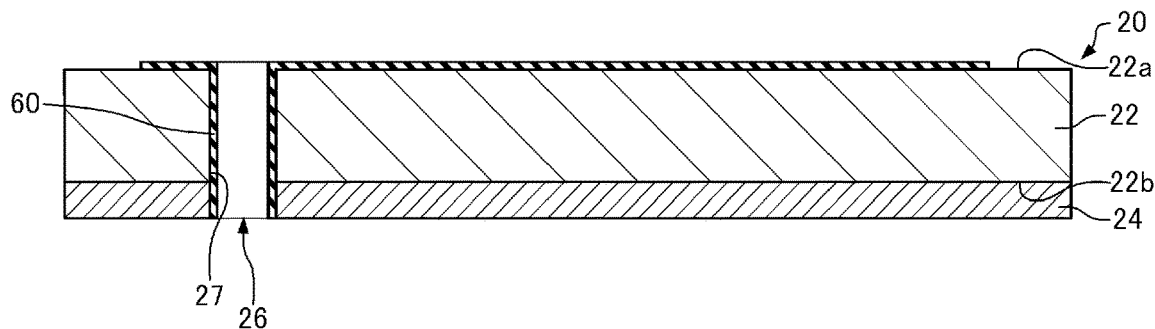
FIG. 7 is a sectional view schematically showing the manufacturing process of the vibrator device according to the first embodiment.

Then, as shown in FIG. 7, the through holes 26 are formed in the silicon substrate 22 and the circuit unit 24. The through holes 26 may be formed by e.g. dry etching using inductively coupled plasma. Thereby, the IC board 20 is obtained.

Then, the silicon oxide layer 60 is formed on the first surface 22a of the silicon substrate 22 and the inner walls 27 defining the through holes 26. The silicon oxide layer 60 may be formed using e.g. various vapor phase deposition methods. Note that the silicon oxide layer 60 may be formed by thermal oxidation of the silicon substrate 22.

Figure 8:
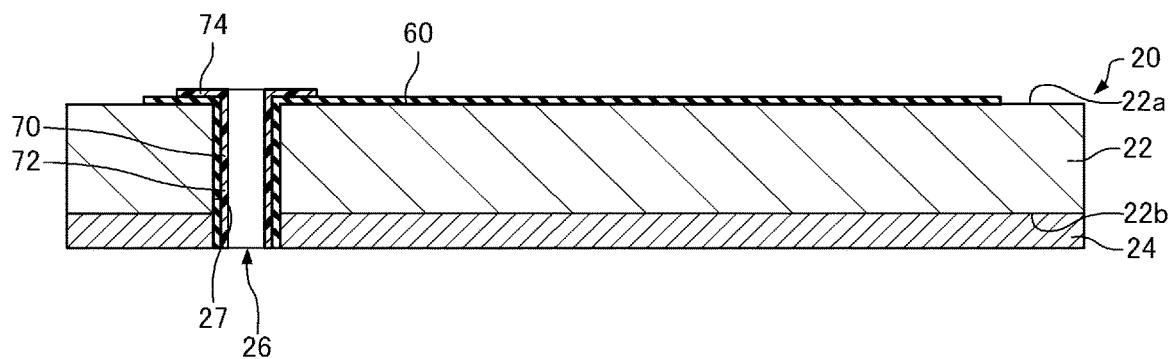
FIG. 8 is a sectional view schematically showing the manufacturing process of the vibrator device according to the first embodiment.

Then, as shown in FIG. 8, the resin layers 70 are formed on the silicon oxide layer 60. For example, a photosensitive resin material is applied onto the silicon oxide layer 60 and exposed to light and developed, and thereby, the resin layers 70 having the first portions 72 and the second portions 74 may be formed.

Figure 9:
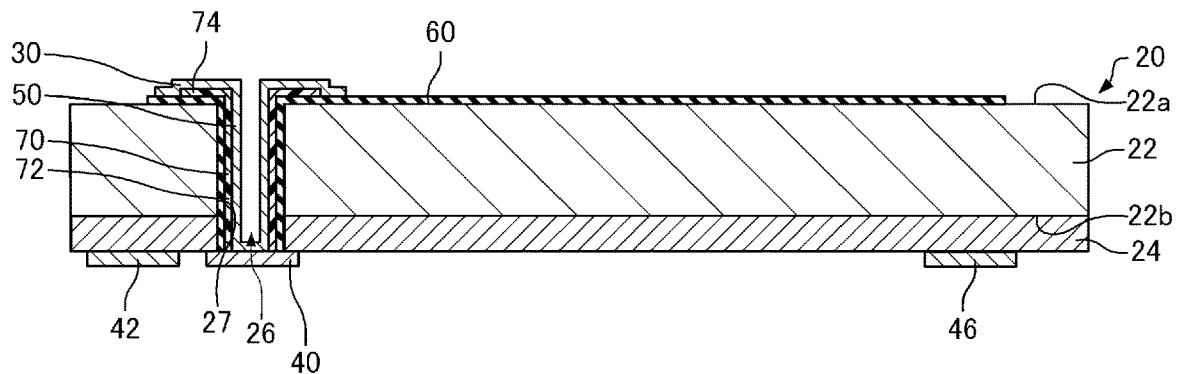
FIG. 9 is a sectional view schematically showing the manufacturing process of the vibrator device according to the first embodiment.

Then, as shown in FIG. 9, a conducting film is deposited on the first surface 22a of the silicon substrate 22 and the inner walls 27 defining the through holes 26. For the deposition of the conducting film, e.g. electrolytic plating, vapor phase deposition, or the like is used. After the deposition of the conducting film, the conducting film is patterned in an intended shape using various patterning methods. Thereby, the first terminals 30, the second terminals 40, the external electrode 42, the external electrode 44, the external electrode 46, the external electrode 48, and the wires 50 can be formed.

Figure 10:
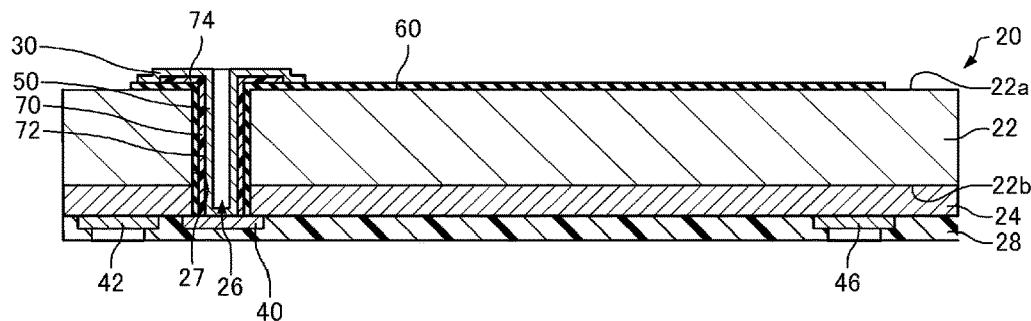
FIG. 10 is a sectional view schematically showing the manufacturing process of the vibrator device according to the first embodiment.

Then, as shown in FIG. 10, the passivation film 28 is deposited and the passivation film 28 is patterned so that the external electrode 42, the external electrode 44, the external electrode 46, and the external electrode 48 are exposed.

Figure 11:
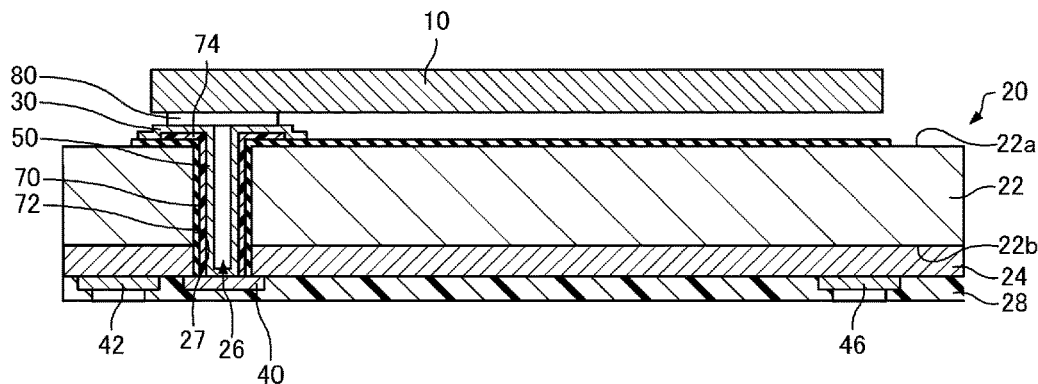
FIG. 11 is a sectional view schematically showing the manufacturing process of the vibrator device according to the first embodiment.

Then, as shown in FIG. 11, the vibrator element 10 is prepared and the vibrator element 10 is bonded to the first terminals 30 via the metal bumps 80.

Specifically, first, the plurality of metal bumps 80 are formed on the first terminals 30. The metal bumps 80 are formed by e.g. electroless plating. The metal bumps 80 are formed by electroless plating, and thereby, many of the metal bumps 80 may be formed at the same time. Accordingly, for example, when many metal bumps 80 are formed, the bumps may be formed in a shorter time compared to a case using stud bumps. Further, the metal bumps 80 are formed by electroless plating, and thereby, metal bumps 80 in various shapes can be easily formed. Then, the vibrator element 10 and the metal bumps 80 are bonded. The vibrator element 10 and the metal bumps 80 are bonded by e.g. Au—Au bonding.

Note that, here, the case where the metal bumps 80 are formed on the first terminals 30 for bonding the vibrator element 10 and the first terminals 30 is explained. However, the metal bumps 80 may be formed on the vibrator element 10 for bonding the vibrator element 10 and the first terminals 30.

Then, a silicon substrate (not shown) for formation of the lid 90 is prepared and, as shown in FIG. 3, a recess to be the cavity 2 is formed. The recess may be formed by e.g. dry etching using inductively coupled plasma.

Then, the silicon substrate 22 and the lid 90 are superimposed so that the vibrator element 10 can be held in the recess of the lid 90, and put into a chamber of a bonding device. Then, the chamber is depressurized, and thereby, the silicon substrate 22 and the lid 90 are brought into close contact, kept in a predetermined time, and directly bonded. During the bonding, the cavity 2 is kept in the reduced-pressure condition.

In the above described process, the vibrator device 100 can be manufactured.

1.3. Effects

In the vibrator device 100, the resin layers 70 are placed between the wires 50 and the inner walls 27 defining the through holes 26, and the silicon oxide layer 60 is placed between the resin layers 70 and the inner walls 27. That is, in the vibrator device 100, the silicon oxide layer 60 and the resin layers 70 are placed between the wires 50 and the silicon substrate 22. Accordingly, for example, compared to a case where only the silicon oxide layer 60 is placed between the wires 50 and the silicon substrate 22, parasitic capacitance formed between the wires 50 and the silicon substrate 22 can be made smaller.

Here, for example, the silicon oxide layer 60 is formed to be thicker, and thereby, the parasitic capacitance formed between the wires 50 and the silicon substrate 22 can be made smaller. However, the silicon oxide layer 60 is harder than the resin layers 70, and thus, when the silicon oxide layer 60 is formed to be thicker, warpage may occur in the silicon substrate 22 due to internal stress of the silicon oxide layer 60. In the vibrator device 100, the resin layers 70 softer than the silicon oxide layer 60 are placed between the wires 50 and the silicon substrate 22 in addition to the silicon oxide layer 60, and thereby, the parasitic capacitance can be made smaller without warpage of the silicon substrate 22.

In the vibrator device 100, the resin layers 70 are further placed between the first surface 22a of the silicon substrate 22 and the first terminals 30. Accordingly, in the vibrator device 100, the resin layers 70 deform when the vibrator element 10 and the metal bumps 80 are bonded, and thereby, the vibrator element 10 and the metal bumps 80 can be brought into contact in wider areas, stable bonding can be performed, and coupling reliability can be improved. Therefore, in the vibrator device 100, compared to a case where only the silicon oxide layer 60 is placed between the first surface 22a of the silicon substrate 22 and the first terminals 30, an influence on the vibration characteristics by variations in bonding condition of the vibrator element 10 can be reduced. Further, for example, in the vibrator device 100, an impact when the vibrator element 10 and the metal bumps 80 are bonded can be absorbed by the resin layers 70.

In the vibrator device 100, the resin layers 70 are covered by the wires 50 and the first terminals 30. Accordingly, in the vibrator device 100, an amount of gas generated in the resin layers 70 and released into the cavity 2 can be reduced. Note that part of the resin layers 70 may be exposed, however, as shown in FIG. 3, it is preferable that the whole resin layers 70 are covered by the wires 50 and the first terminals 30 and the resin layers 70 are not exposed. Thereby, the amount of gas released into the cavity 2 can be further reduced.

The vibrator device 100 includes the plurality of metal bumps 80 bonding the vibrator element 10 and the first terminals 30. In the vibrator device 100, the vibrator element 10 and the first terminals 30 are bonded by the plurality of metal bumps 80, and thus, for example, compared to a case of bonding using the single metal bump 80, stress generated by bonding and stress due to thermal strain can be reduced.

In the vibrator device 100, in the plan view, the through hole 26 is placed between the first metal bump 81 and the second metal bump 82. Accordingly, the bonding condition of the vibrator element 10 can be stabilized. For example, if the vibrator element 10 is bonded using only the first metal bumps 81 shown in FIG. 2, the vibrator element 10 can be easily tilted and the bonding condition of the vibrator element 10 is unstable.

In the vibrator device 100, in the plan view, the through hole 26 is placed between the first metal bump 81 and the second metal bump 82 and, in the plan view, the first metal bump 81 and the second metal bump 82 do not overlap with the through hole 26. For example, when the first metal bump 81 overlaps with the through hole 26, the first metal bump 81 lies over the through hole 26 and hinders stable bonding. On the other hand, in the vibrator device 100, in the plan view, the first metal bump 81 and the second metal bump 82 do not overlap with the through hole 26, and thereby, stable bonding can be performed.

2. Second Embodiment

Figure 12:
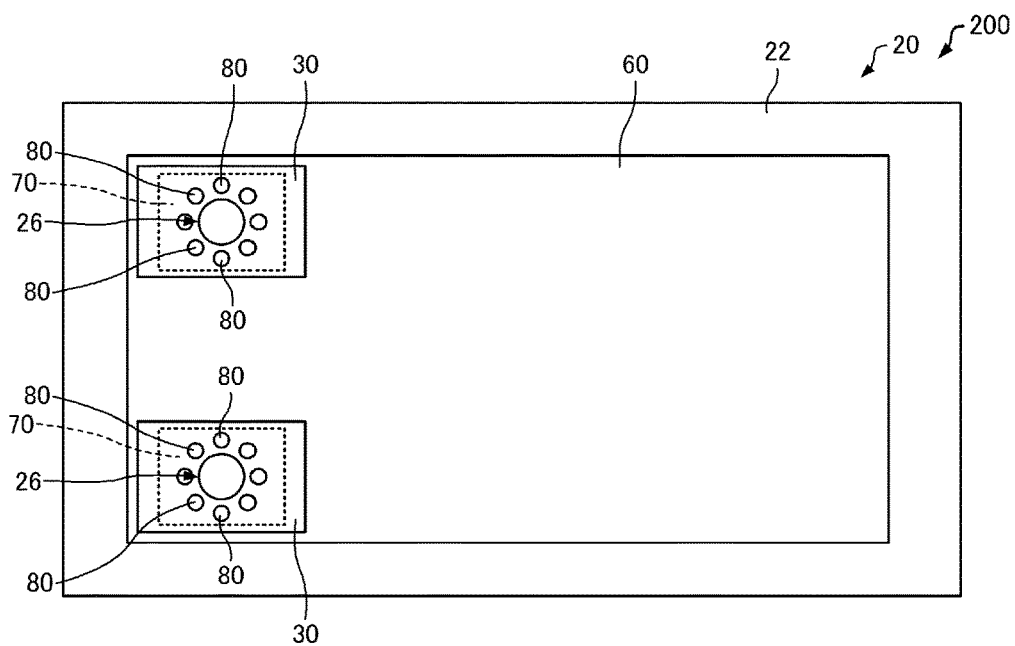
FIG. 12 is a plan view schematically showing a vibrator device according to a second embodiment.

Next, the vibrator device according to the second embodiment will be explained with reference to the drawings. FIG. 12 is a plan view schematically showing the vibrator device 200 according to the second embodiment. FIG. 12 corresponds to FIG. 2.

As below, in the vibrator device 200 according to the second embodiment, the members having the same functions as those of the component members of the vibrator device 100 according to the above described first embodiment have the same signs and the detailed explanation thereof will be omitted.

In the vibrator device 200, as shown in FIG. 12, the plurality of metal bumps 80 are placed along the outer edges of the through holes 26 in the plan view. In the example shown in FIG. 12, 12 metal bumps 80 are placed at equal intervals to surround the outer edges of the through holes 26. Note that the number and arrangement of the metal bumps 80 are not particularly limited as long as the plurality of metal bumps 80 are placed along the outer edges of the through holes 26 in the plan view.

The plurality of metal bumps 80 are formed by e.g. electroless plating. Accordingly, the plurality of metal bumps 80 can be formed in a short time. Further, even when the diameters of the metal bumps 80 are small as shown in FIG. 12, the metal bumps 80 can be easily formed.

In the vibrator device 200, the plurality of metal bumps 80 are placed along the outer edges of the through holes 26 in the plan view, and thus, the vibrator element 10 can be harder to be tilted and the bonding condition of the vibrator element 10 can be stabilized. Further, for example, compared to a case of bonding by the single metal bump 80, stress generated by bonding and stress due to thermal strain can be reduced.

3. Third Embodiment

Figure 13:
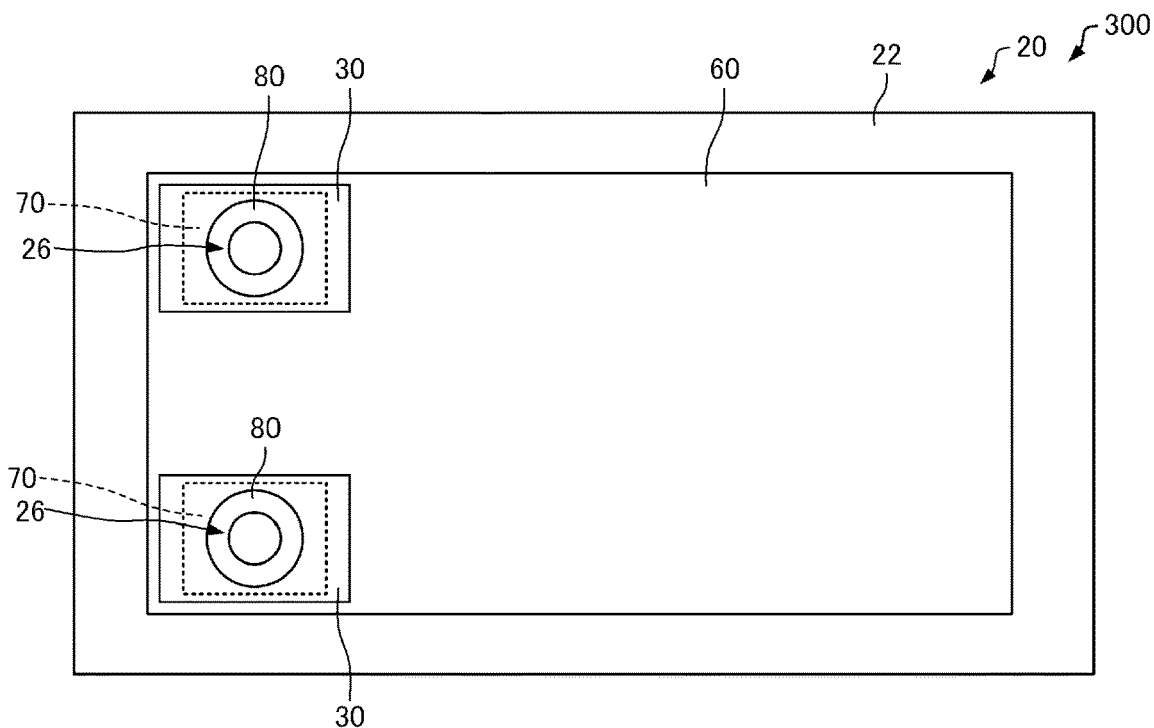
FIG. 13 is a plan view schematically showing a vibrator device according to a third embodiment.

Next, the vibrator device according to the third embodiment will be explained with reference to the drawings. FIG. 13 is a plan view schematically showing the vibrator device 300 according to the third embodiment. FIG. 13 corresponds to FIG. 2.

As below, in the vibrator device 300 according to the third embodiment, the members having the same functions as those of the component members of the vibrator device 100 according to the above described first embodiment have the same signs and the detailed explanation thereof will be omitted.

In the vibrator device 300, as shown in FIG. 13, the single metal bump 80 is placed on the first terminal 30. The metal bump 80 surrounds the through hole 26 in the plan view. In the example shown in FIG. 13, the metal bump 80 has a circular ring shape in the plan view and the through hole 26 is located inside of the ring. Note that the shape of the metal bump 80 is not limited to the circular ring shape, but may be any shape closed in the plan view with the through hole 26 located inside thereof.

The ring-shaped metal bumps 80 are formed by e.g. electroless plating. In the electroless plating, even the ring-shaped metal bumps 80 can be easily and accurately formed.

In the vibrator device 300, the metal bumps 80 surround the through holes 26 in the plan view, and thereby, stress generated by bonding and stress due to thermal strain can be reduced.

4. Fourth Embodiment

Figure 14:
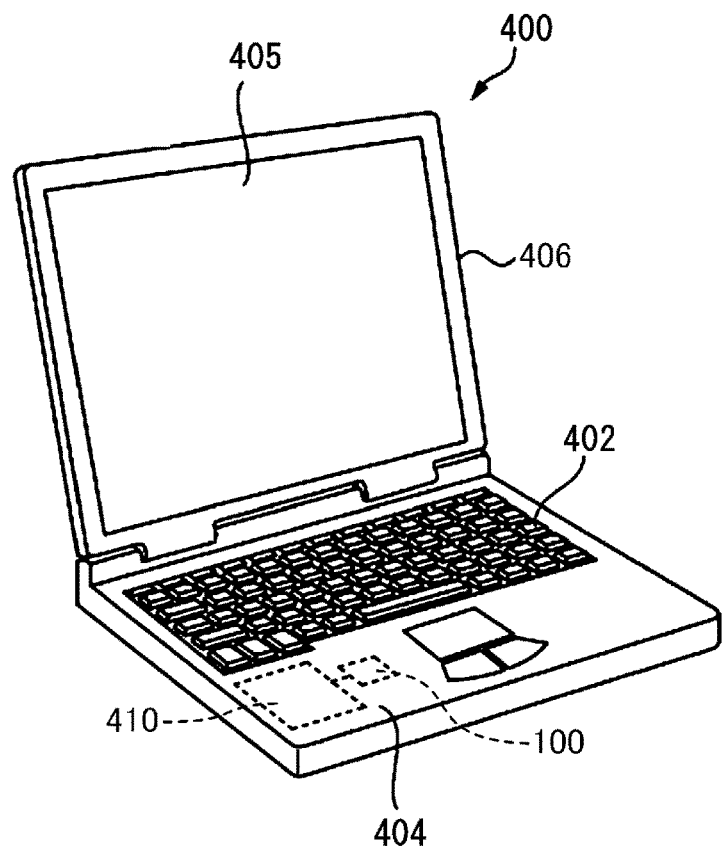
FIG. 14 is a perspective view schematically showing an electronic apparatus according to a fourth embodiment.

Next, the electronic apparatus according to the fourth embodiment will be explained with reference to the drawings. FIG. 14 is a perspective view schematically showing a personal computer 400 as the electronic apparatus according to the fourth embodiment.

As shown in FIG. 14, the personal computer 400 includes a main body 404 having a keyboard 402 and a display unit 406 having a display 405. The display unit 406 is supported pivotably relative to the main body 404 via a hinge structure.

The personal computer 400 further includes the vibrator device 100 that functions as an oscillator. Further, the personal computer 400 includes an arithmetic circuit 410 for arithmetic processing relating to control of the keyboard 402 and the display 405. The arithmetic circuit 410 operates by the output signal from the vibrator device 100.

As described above, the personal computer 400 as the electronic apparatus includes the vibrator device 100 and the arithmetic circuit 410 that performs signal processing based on an oscillated signal as the output signal of the vibrator device 100. Accordingly, the effects of the above described vibrator device 100 can be enjoyed.

Note that the electronic apparatus including the vibrator device 100 may be the above described personal computer 400, and additionally, e.g. a digital still camera, smartphone, tablet terminal, timepiece (including smartwatch), inkjet ejection apparatus (e.g. inkjet printer), wearable terminal including HMD (head mounted display), laptop personal computer, television, video camera, video tape recorder, car navigation system, pager, personal digital assistance (with or without communication function), electronic dictionary, calculator, electronic game machine, word processor, work station, videophone, security television monitor, electronic binoculars, POS terminal, medical apparatus such as electronic thermometer, sphygmomanometer, blood glucose meter, electrocardiographic measurement apparatus, ultrasonic diagnostic apparatus, or electronic endoscope, fish finder, various measurement instruments, meters and gauges for vehicles, aircrafts, and watercrafts, base station for mobile terminal, flight simulator, etc.

The present disclosure is not limited to the above described embodiments, but various other modifications can be made. For example, the present disclosure includes substantially the same configurations as the configurations explained in the embodiments. "Substantially the same configurations" refer to e.g. configurations having the same functions, methods, and results or configurations having the same purposes and effects. Further, the present disclosure includes configurations formed by replacement of unessential parts of the configurations explained in the embodiments. Furthermore, the present disclosure includes configurations that exert the same effects or achieve the same purposes as those of the configurations explained in the embodiments. Moreover, the present disclosure includes configurations formed by addition of publicly known technologies to the configurations explained in the embodiments.

What is claimed is:

1. A vibrator device comprising:
   a silicon substrate having a through hole;
   a first terminal placed on a first surface of the silicon substrate;
   a second terminal placed on a second surface opposite to the first surface of the silicon substrate;
   a wire passing the through hole and electrically coupling the first terminal and the second terminal;
   a resin layer placed between the wire and an inner wall defining the through hole;
   a silicon oxide layer placed between the resin layer and the inner wall; and
   a vibrator element bonded to the first terminal.

2. The vibrator device according to claim 1, wherein the resin layer is further placed between the first surface and the first terminal.

3. The vibrator device according to claim 2, further comprising a lid bonded to the first surface, wherein
   the lid and the silicon substrate form a cavity that accommodates the vibrator element, and
   the resin layer is covered by the wire and the first terminal.

4. The vibrator device according to claim 2, further comprising a plurality of metal bumps bonding the vibrator element and the first terminal.

5. The vibrator device according to claim 4, wherein
   the plurality of metal bumps include a first metal bump and a second metal bump, and
   the through hole is placed between the first metal bump and the second metal bump in a plan view.

6. The vibrator device according to claim 4, wherein
   the plurality of metal bumps are placed along an outer edge of the through hole in a plan view.

7. The vibrator device according to claim 2, further comprising a single metal bump bonding the vibrator element and the first terminal, wherein
   the single metal bump surrounds the through hole in a plan view.

8. The vibrator device according to claim 1, further comprising an oscillation circuit electrically coupled to the second terminal and generating an oscillation signal.

9. An electronic apparatus comprising:
   the vibrator device comprising
      a silicon substrate having a through hole;
      a first terminal placed on a first surface of the silicon substrate;
      a second terminal placed on a second surface opposite to the first surface of the silicon substrate;
      a wire passing the through hole and electrically coupling the first terminal and the second terminal;
      a resin layer placed between the wire and an inner wall defining the through hole;
      a silicon oxide layer placed between the resin layer and the inner wall; and
      a vibrator element bonded to the first terminal; and
   an arithmetic circuit that operates by an output signal from the vibrator device.

* * * * *